United States Patent [19]
Paterson et al.

[11] Patent Number: 5,894,162
[45] Date of Patent: Apr. 13, 1999

[54] HIGH DENSITY EPROM CELL AND PROCESS FOR FABRICATING SAME

[75] Inventors: James L. Paterson, Richardson; Gregory James Armstrong, Dallas, both of Tex.

[73] Assignee: Texas Instruments Incorporated, Dallas, Tex.

[21] Appl. No.: 07/966,615

[22] Filed: Oct. 26, 1992

Related U.S. Application Data

[63] Continuation of application No. 07/707,242, May 22, 1991, abandoned, which is a continuation of application No. 07/526,961, May 22, 1990, abandoned, which is a continuation of application No. 07/128,549, Dec. 3, 1987, abandoned.

[51] Int. Cl.[6] .................................................. H01L 29/788
[52] U.S. Cl. .......................... 257/316; 257/315; 257/384; 257/390
[58] Field of Search ........................ 357/23.5; 257/316, 257/314, 315, 384, 390

[56] References Cited

U.S. PATENT DOCUMENTS

| | | | |
|---|---|---|---|
| 3,787,223 | 1/1974 | Reedy, Jr. | 117/69 |
| 4,184,207 | 1/1980 | McElroy | 365/185 |
| 4,222,062 | 9/1980 | Trotter et al. | 357/45 |
| 4,222,063 | 9/1980 | Rodgers | 357/23.5 |
| 4,326,331 | 4/1982 | Guterman | 357/23.5 |
| 4,373,248 | 2/1983 | McElroy | 29/571 |
| 4,446,476 | 5/1984 | Isaac | 357/67 |
| 4,451,904 | 5/1984 | Sugiura et al. | 357/23.5 |
| 4,561,004 | 12/1985 | Kuo et al. | 357/23.5 |
| 4,581,622 | 4/1986 | Takasaki et al. | 357/23.5 |
| 4,597,060 | 6/1986 | Mitchell et al. | 357/23.5 |
| 4,629,635 | 12/1986 | Brors | 427/255.2 |
| 4,698,900 | 10/1987 | Esguivel | 357/23.5 |
| 4,780,424 | 10/1988 | Holler et al. | 357/23.5 |
| 4,795,722 | 1/1989 | Welch et al. | 357/54 |
| 4,812,885 | 3/1989 | Riemenschneider | 357/23.5 |
| 4,812,898 | 3/1989 | Sumihiro | 357/23.5 |
| 4,814,840 | 3/1989 | Kameda | 357/23.5 |
| 4,833,514 | 5/1989 | Esguivel et al. | 357/23.5 |

*Primary Examiner*—Ngân V. Ngô
*Attorney, Agent, or Firm*—Mark A. Valetti; Carlton H. Hoel; Richard L. Donaldson

[57] ABSTRACT

An EPROM disclosed in this specification includes a unique floating gate memory cell which may be charged using a reduced voltage level. The memory cells are fabricated using a mask to define the buried source, drain, and field oxide regions of the memory cell. After removal of the mask, field oxide regions are formed and a floating gate is fabricated which extends beyond the boundaries of the channel region for the floating gate field effect transistor memory cell. This extended floating gate provides additional capacitive coupling between the gate/word line and the floating gate while maintaining the same capacitive coupling between the floating gate and the channel of the floating gate field effect transistor memory cell. One embodiment discloses a silicide which is applied to the buried source and drain regions. The silicide is fabricated by forming a slot through the field oxide, forming a silicide on the diffused regions, refilling the slot with an oxide, and planarizing the resulting structure.

8 Claims, 5 Drawing Sheets

HIGH DENSITY EPROM CELL AND PROCESS FOR FABRICATING SAME

This application is a continuation of application Ser. No. 07/707,242, filed May 22, 1991, now abandoned, which is a continuation of application Ser. No. 07/526,961, filed May 22, 1990, now abandoned, which is a continuation of application Ser. No. 07/128,549, filed Dec. 3, 1987, now abandoned.

FIELD OF THE INVENTION

This invention relates to the field of integrated circuit fabrication. More specifically, this invention relates to the field of electrically programmable read only memories and their fabrication.

BACKGROUND OF THE INVENTION

One goal in the fabrication of integrated circuitry is to produce a circuit having maximum circuit density. More succinctly, the goal is to provide more circuit capability in a smaller circuit surface area. This goal extends to the fabrication of EPROMs. An EPROM is a read only memory device in which stored data may be erased and new data written in its stead. A widely used type of EPROM is the floating gate field effect transistor type.

Figure 1:
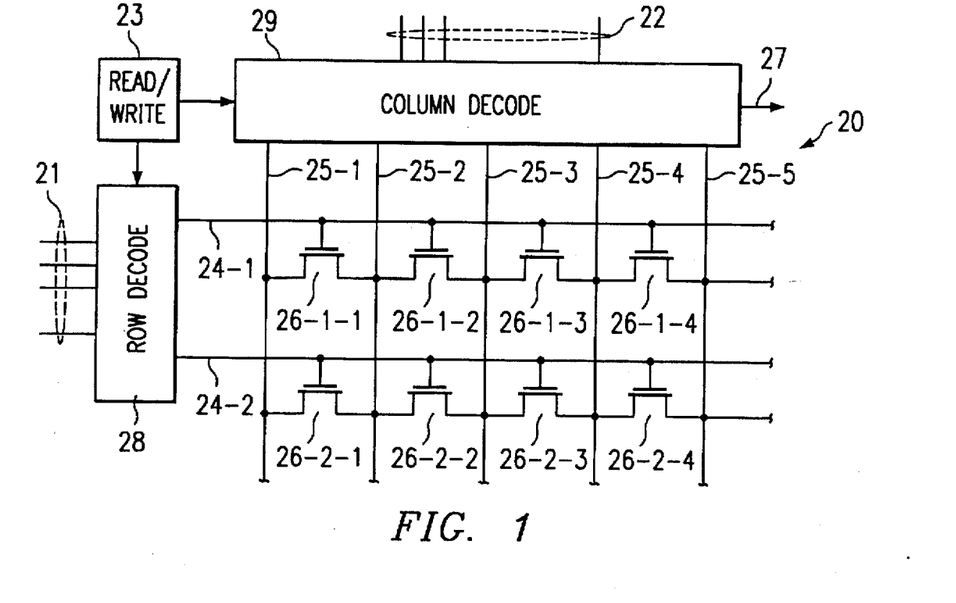
FIG. 1 is a schematic diagram of an EPROM using floating gate field effect transistors.

A partial schematic diagram of an EPROM using floating gate field effect transistors is shown in FIG. 1. Memory cells 26-1-1 through 26-2-4 are floating gate field effect transistors. Row decoder 28 provides output signals on row lines 24-1 and 24-2 in response to signals provided on row address input leads 21 and from read/write indicator 23. Column decoder 29 provides and receives signals on column lines 25-1 through 25-5 in response to signals provided on column address input leads 22 and from read/write indicator 23. A memory output signal is provided on output lead 27. A data bit stored in, for example, memory cell 26-1-1 is read by providing a high voltage output signal on row line 24-1 and providing a low voltage output signal on all other row lines. Column decoder 29 then senses, via column lines 25-1 and 25-2, the impedance of memory cell 26-1-1. If the floating gate of memory cell 26-1-1 contains excess electrons, the negative charge of these excess electrons raises the threshold voltage of memory cell 26-1-1 so that the voltage provided on row line 24-1 is insufficient to cause the channel of memory cell 26-1-1 to conduct. Therefore, column decoder 29 detects a high impedance and provides an appropriate signal on output lead 27. If there are no excess electrons stored on the floating gate of memory cell 26-1-1, then the voltage supplied on row line 24-1 is sufficient to cause memory cell 26-1-1 to conduct. Therefore, column decoder 29 detects a low impedance and provides the appropriate signal on output lead 27.

EPROM 20 is thus programmed by negatively charging the floating gate of selected memory cells. This is accomplished by injecting electrons through the insulating layer between the floating gate and the substrate of the memory cell. One fact of particular importance in understanding the present invention is the relationship between this injection and the electric field from the floating gate to the channel of a floating gate field effect transistor. The greater the field between the floating gate and the channel of the floating gate field effect transistor, the greater the injection or discharge current, depending upon the polarity of the electric field.

One prior art method for fabricating an EPROM that includes floating gate field effect transistor memory cells is described in McElroy, U.S. Pat. No. 4,373,248, entitled "Method of Making High Density Semiconductor or the Like", issued Feb. 15, 1983, and assigned to the assignee of the present invention. As shown in FIGS. 8A–8F thereof, the floating gate patterns and defines the channel area of the floating gate field effect transistor memory cells. Experimental evidence has shown that the EPROM cell of McElroy requires a voltage level of approximately 18 volts (for a floating gate to substrate insulator of silicon dioxide having a thickness of 350 angstroms and an interpoly insulator composed of 250 angstroms of silicon nitride and 250 angstroms of silicon dioxide) on the control gate (row line) to efficiently transfer charge through the insulator from the channel to the floating gate. This voltage limits the extent to which the EPROM cell of McElroy can be reduced in size because that voltage level requires certain spacing between active elements in order to avoid breakdown currents and unwanted field effects in the EPROM. Therefore, it is desirable to provide an EPROM cell which may be programmed using a minimum voltage level.

Moreover, a conventional buried diffusion which forms at least a portion of a column line 25 (see FIG. 1) may exhibit a resistance of around 30 ohms per square. This amount of resistance is typically too high for the buried diffusion alone to operate as a column line. Thus, memory arrays typically include a metallic strapping line which parallels and overlies a buried diffusion line to lower this resistance. A contact between the buried diffusion and metallic strapping line is provided for each of a predetermined number of memory cells. As a result, a column line includes a metallic strapping line electrically in parallel with a buried diffusion line, and the overall impedance of a column line greatly decreases compared to the impedance achievable with the use of only a buried diffusion line.

However, semiconductor substrate area must be dedicated to providing the contacts between the metallic strapping lines and the buried diffusion lines. This contact area lowers the memory array cell density over the density which could be achieved if some of the contact areas could instead be used for memory cells. Therefore, it is desirable to provide an EPROM cell which requires fewer contacts between buried diffusion lines and metallic strapping lines.

SUMMARY OF THE INVENTION

Accordingly, it is an advantage of the present invention that a high capacitance coupling is provided between floating gates and control gates of memory cell transistors. A high capacitance coupling permits the use of lower voltages during programming, and spacing between active elements decreases as a result.

Another advantage of the present invention is that a silicide layer is formed on buried column lines. Consequently, the resistance of a buried column line decreases, and fewer contacts between buried column lines and metallic strapping lines are required. In addition, the decreased resistance lowers an overall RC time constant associated with read operations of the EPROM. Faster read operations result.

The above and other advantages of the present invention are carried out in one form by an EPROM having a unique floating gate memory cell which may be charged using a reduced voltage level. The memory cell is fabricated using a mask to define buried source/drain and field oxide regions of the memory cell. A floating gate is fabricated which extends beyond the boundaries of the channel region for the floating gate field effect transistor memory cell. This extended floating gate provides additional capacitive coupling between the gate/word line and the floating gate while maintaining substantially the same capacitive coupling between the floating gate and the channel of the floating gate field effect transistor memory cell. This arrangement provides a greater electric field between the floating gate and the channel of the floating gate field effect memory transistor cell for given voltage levels on the gate, source, and drain of the floating gate field effect transistor memory cell. Therefore, a lower voltage level may be used to write data into the EPROM cell.

DETAILED DESCRIPTION

Figure 2A:
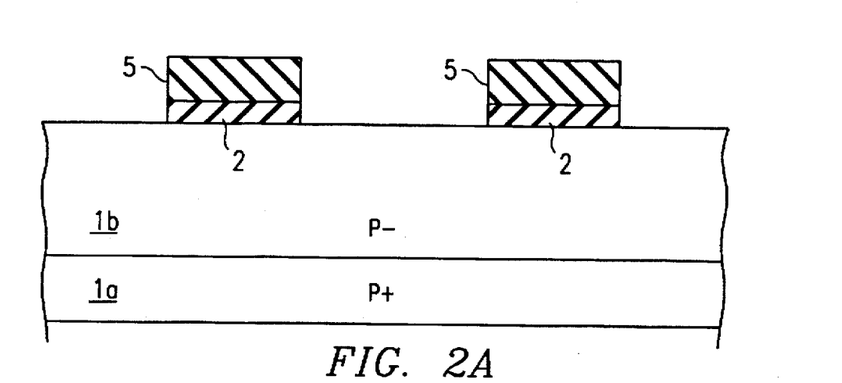
FIGS. 2A through 2G are schematic side-view diagrams depicting the processing steps necessary to fabricate a floating gate field effect transistor memory cell according to the teachings of this invention.

FIGS. 2A through 2G are side-view schematic diagrams depicting the processing steps for fabricating an EPROM according to one embodiment of the present invention. The process of this embodiment begins with a P− epitaxial layer 1b formed on a P+ substrate 1a as shown in FIG. 2A. An initial oxide layer 2 is then formed by thermal oxidation in a steam ambient at 900° C. for approximately 10 minutes to a thickness of approximately 350 angstroms. A silicon nitride layer 5 is then formed on the surface of oxide layer 2 by low pressure chemical vapor deposition (LPCVD) to a thickness of approximately 1000 angstroms. Silicon dioxide layer 2 and silicon nitride layer 5 are then patterned and etched using a technique well known in the art. The resulting structure, shown in FIG. 2A, includes etched portions which generally correspond to column lines 25 (see FIG. 1).

FIG. 2A shows the initial step for fabricating two adjacent floating gate field effect transistor memory cells. A complete EPROM will contain any number of memory cells limited only by fabrication techniques and the surface area of substrate 1a. Thus, although FIGS. 2A through 2G describe the fabrication of two memory cells, it is understood that many more memory cells are fabricated in conjunction with the two cells shown in FIGS. 2A through 2G and that the cells extend to both the left and right-hand side of the page and in the plane perpendicular to the page both into the page and out of the page.

Figure 2B:
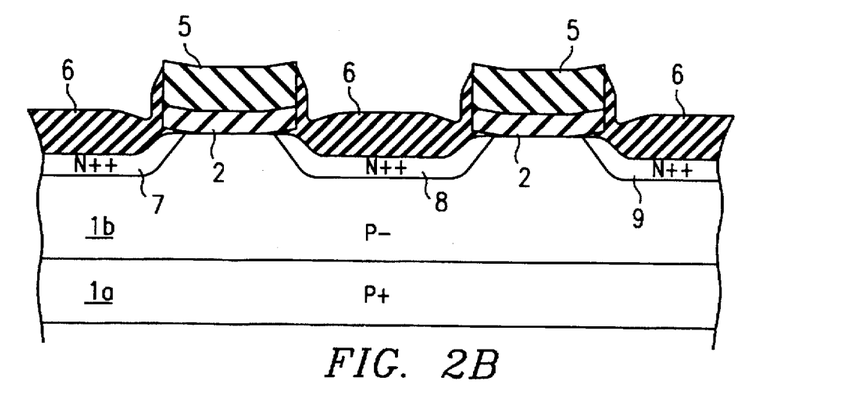

The structure of FIG. 2A is next subjected to an implantation of arsenic ions having an energy of approximately 50 kiloelectron volts and a density of approximately 1E16 ions/cm$^2$, and/or phosphorus ions having an energy of around 100 kiloelectron volts and a density of about 1E15 ions/cm$^2$. This ion implantation is then annealed in a nitrogen environment at approximately 900° C. for approximately 100 minutes. Field insulation regions, such as field oxide regions 6, may then be grown by thermal oxidation in a steam environment at approximately 850° C. for approximately 20 minutes to a thickness of approximately 4,000 angstroms as shown in FIG. 2B. N++ regions 7, 8, and 9 represent regions where ion implantation occurred. Thus, regions 7, 8, and 9 function as the source/drain regions of the floating gate field effect transistor memory cells. Silicon nitride layer 5 may next be deglazed and removed using techniques well known in the art.

Figure 2C:
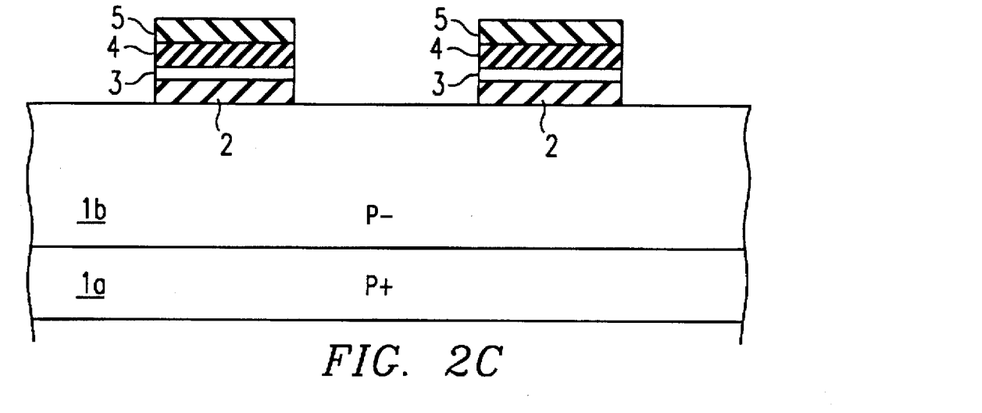

In a second embodiment, a stack has a silicon dioxide layer 4 and a polycrystalline silicon layer 3 formed between silicon dioxide layer 2 and silicon nitride layer 5, as shown in FIG. 2C. This stack is used to pattern field oxide regions 6 and N++ source/drain regions 7, 8, and 9 (see FIG. 2B). Polycrystalline silicon layer 3 is included to provide a field plate periphery isolation region (not shown) for the EPROM. If more conventional isolation methods, such as trench or field oxide isolation, are used, polycrystalline silicon layer 3 and silicon dioxide layer 4 may be omitted.

In a third embodiment, the oxidation mask may be omitted entirely and a simple photoresist mask (not shown) may be used to pattern the ion implantation for N++ source/drain regions 7, 8, and 9. After removing the photoresist mask, the field oxide regions are thermally grown without an oxidation mask. The increased oxidation rate of doped silicon at a temperature of approximately 850° C. results in an oxide growth rate of approximately 8–10 times the growth rate for undoped silicon. Thus, after this oxidation step, thick field oxide regions 6 reside over N++ source/drain regions 7, 8, and 9, while a much thinner oxide is formed over the undoped regions. This thin oxide layer may be used for a gate oxide such as layer 30 shown in FIG. 2D and discussed below.

It will be understood by those skilled in the art that field insulator regions, such as field oxide regions 6, represent substantially different structures than gate oxides. Field insulator regions typically seek to capacitively isolate regions on opposing sides thereof. Consequently, oxides used over P+ substrates for field insulator regions are typically greater than 800 angstroms thick in currently manufactured semiconductor devices. On the other hand, gate oxides must permit coupling through a gate oxide in order for a transistor to properly function. Thus, gate oxides are typically less than 800 angstroms thick in currently manufactured semiconductor devices.

Figure 2D:
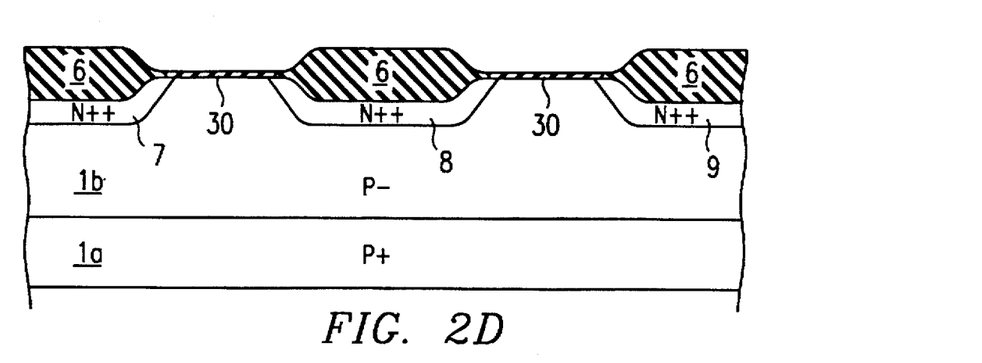

Returning to the initial embodiment, after removing silicon nitride layer 5, the structure shown in FIG. 2D remains. The structure of FIG. 2D may be subjected to a silicon dioxide etch using techniques well known in the art to strip silicon dioxide between field oxide regions 6. Thermal oxidation may then be performed in an oxygen ambient including 5 percent hydrochloric acid at a temperature of approximately 900° C. for approximately 45 minutes to provide gate oxide layers 30 between field oxide regions 6. Gate oxide layers 30 are approximately 300 angstroms thick.

Figure 2E:
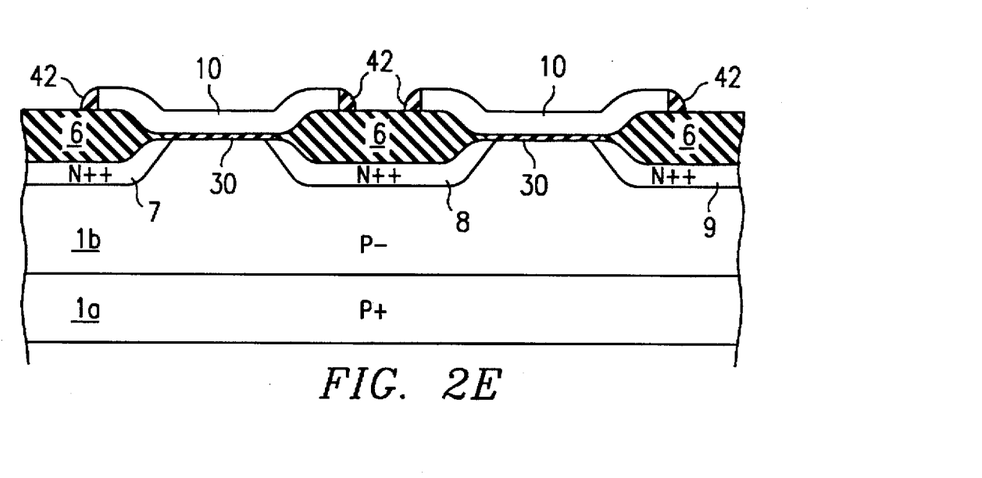
Figure 3:
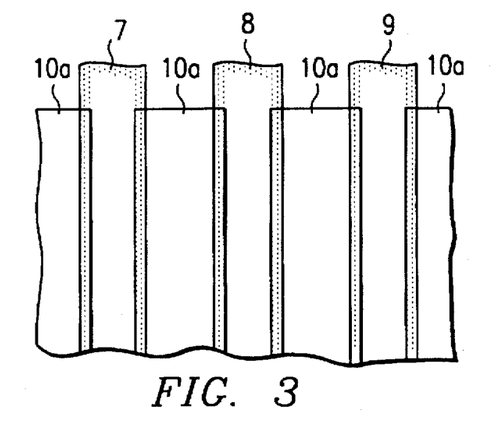
FIG. 3 is a plan view of an intermediate step in the process illustrated by FIGS. 2A through 2G.

A polycrystalline silicon (poly) layer 10 is deposited using low pressure chemical vapor depositing to a thickness of approximately 2,000 angstroms, as shown in FIG. 2E. Poly layer 10 is doped by diffusing POCl3 for approximately 10 minutes at a temperature of approximately 950° C. Poly layer 10, is then patterned and etched to provide the structure shown in FIG. 2E. At this point poly layer 10 is partially patterned to provide strips 10A, as shown in FIG. 3. Strips 10A are patterned into individual floating gates when the control gates/word lines are patterned in steps described below and as shown in the plan view of FIG. 4.

In the structure of FIG. 2E poly layers 10 extend well beyond the edges of field oxide regions 6. This structure differs from the prior art as shown in McElroy which provides floating gates that extend only to the edge of field oxide regions. The maximum extent of the overlap of field oxide regions 6 by poly regions 10 is limited only by fabrication tolerances required between adjacent poly regions 10.

As a minimum, such overlaps may be characterized as extending substantially onto field oxide regions 6. Thus, the minimum extension of floating gates over the field insulator regions is greater than the minor amount of overlap that might possibly result from the diffusion of a floating gate self-aligned to a field oxide region, as taught in McElroy. This minimum extension may, for example, represent an overlap of one-tenth or more of the field insulator region. In the preferred embodiment field oxide regions 6 are approximately 3 microns wide, and the floating gates overlap each field insulator region for a distance of approximately 1 micron.

Figure 2F:
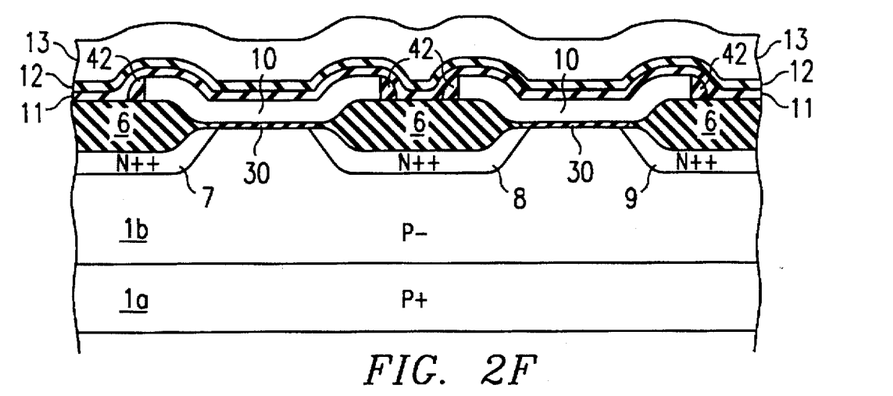

Sidewall oxide filaments 42 may be formed on the edges of poly layer 10 which were exposed in the previous etching step. Filaments 42 seal such edges against electrical leakage and provide smoothing that prevents formation of harmful filaments in a later-occurring poly deposition step. Next, poly layer 10 is deglazed and silicon dioxide layer 11 is deposited overlying poly layer 10 using low pressure chemical vapor deposition at a temperature of approximately 800° C. to a thickness of approximately 250 angstroms, as illustrated by FIG. 2F. Silicon nitride layer 12 is then formed on layer 11 by low pressure chemical vapor deposition at a temperature of approximately 800° C. to a thickness of approximately 250 angstroms.

The combination of silicon dioxide layer 11 and silicon nitride layer 12 is used as a floating gate to active gate insulator in order to increase the dielectric constant over, for example, an insulator of silicon dioxide only. The increased dielectric constant provides increased capacitance between the floating gate and the active gate when compared to capacitance achieved by the use of a silicon dioxide dielectric alone.

The structure is then subjected to thermal oxidation in a steam ambient at a temperature of 1000° C. for 20 minutes to seal the surface of silicon nitride film 12. Polycrystalline silicon (poly) layer 13 is next deposited by low pressure chemical vapor deposition to a thickness of approximately 4,000 angstroms. Poly layer 13, silicon nitride layer 12, silicon dioxide layer 11 and poly layer 10 are then patterned using techniques well known in the art. The remaining portions of poly layer 13 represent conductors running parallel to the plan of the drawing. These parallel conductors provide the row lines 24-1, 24-2, etc. (See FIG. 1) of the EPROM. Buried N++ source/drain regions 7, 8 and 9 are parallel buried conductors which run perpendicular to the page. These provide column lines 25-1, 25-2, etc. (FIG. 1). The remaining portions of poly layer 10 represent individual floating gates for each EPROM cell.

Figure 2G:
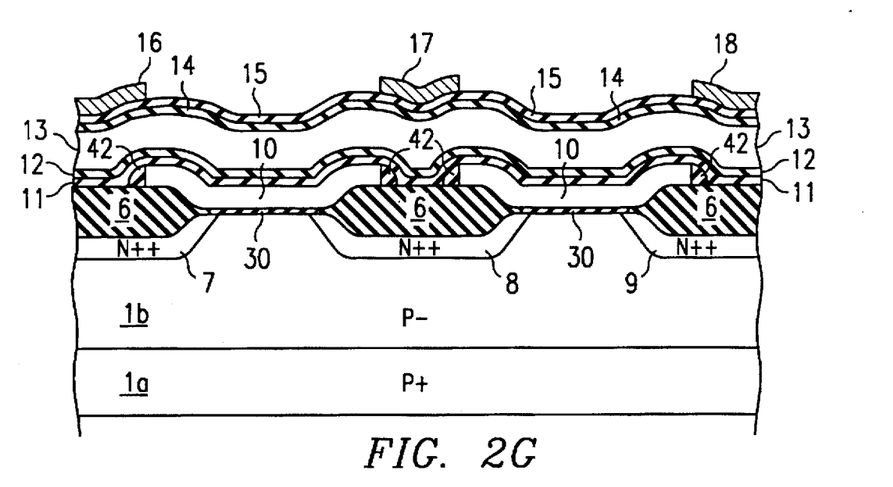

A layer of silicon dioxide (not shown) is grown on the surface of poly layer 13 using an oxygen ambient at a temperature of approximately 1,000° C. for approximately 30 minutes to a thickness of approximately 500 angstroms. This silicon dioxide layer encapsulates poly layers 10 and 13 in a high quality thermal oxide. Another layer of silicon dioxide, which is undoped, may be formed on this silicon dioxide layer or formed separately by tetra ethyl ortho silicate (TEOS) low pressure chemical vapor deposition to form refill silicon dioxide layer 14, as shown in FIG. 2G. A layer of phosphorus-doped, or boron and phosphorus-doped, silicon dioxide 15 is then deposited by atmospheric pressure chemical vapor deposition to a thickness of approximately 10,000 angstroms. Refill oxide layer 14 provides a layer of undoped silicon dioxide which keeps the phosphorus in silicon dioxide layer 15 from doping active regions of the EPROM. A layer of aluminum is then sputtered on the surface of silicon dioxide layer 15 to a thickness of approximately 10,000 angstroms. This aluminum layer is then patterned and etched using techniques well known in the art to provide aluminum column leads 16, 17 and 18. Column leads 16, 17, and 18 run parallel to each buried N++ diffusion, such as buried N++ source/drain regions 7, 8 and 9, as shown in FIG. 2G. The entire integrated circuit is then sealed with a protective overcoat of phosphorus doped silicon dioxide (not shown) deposited using atmospheric pressure chemical vapor deposition to a thickness of approximately 10,000 angstroms. This protective oxide layer is then etched to provide contact points for the integrated circuit.

Figure 4:
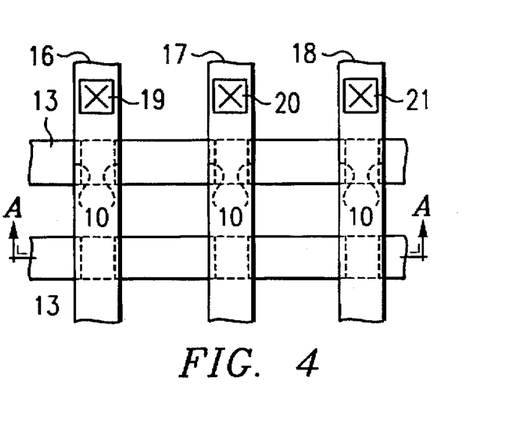
FIG. 4 is a plan view of a portion of an EPROM fabricated according to the teachings of this invention.

FIG. 4 is a plan view of a portion of an EPROM constructed in accordance with the teachings of this invention. Contact points 19, 20 and 21 are openings which permit contact between metal regions 16, 17, and 18 to N++ source/drain regions 7, 8, and 9, respectively. Buried source/drain regions 7, 8, and 9 cannot be used as a sole conductor for the column leads of an EPROM because of their high resistance which is typically about 30 ohms/square, but may be lower if a particular conductive region is incorporated as discussed below. Regardless of whether a conductive region is used, metal regions 16, 17, and 18 periodically contact N++ source/drain regions 7, 8, and 9, respectively, in order to lower the overall resistance of the column lead formed by, for example, metal region 17 in conjunction with N++ source/drain region 8. Cut-away point AA of FIG. 4 shows the region from which the side views shown in FIGS. 2A through 2G are taken. It will be understood that fewer of such contacts are required when the conductive region discussed below is incorporated.

A floating gate field effect transistor memory cell constructed according to the teachings of this invention provides much greater capacitive coupling between polysilicon region 13 and floating gates 10 than between floating gates 10 and epitaxial layer 1b. This structure can be modeled electrically by a series of two capacitors. The voltage across a capacitor is given by the equation, $$V = Q/C, \text{ where} \tag{1}$$

V is equal to the voltage across the capacitor,

Q is equal to the charge on the capacitor, and

C is equal to the capacitance of the capacitor.

With capacitors in series, Q is equal for all capacitors. The proportion of the total voltage across both capacitors in series is solved from the equation, $$V1/Vt = (Q/C1)/(Q/C1 + Q/C2), \text{ where} \tag{2}$$

V1 is the voltage across capacitor 1,

Vt is equal to the total voltage across both capacitors,

C1 is the capacitance of the first capacitor, and

C2 is the capacitance of the second capacitor.

Solving this equation we find that, $$V1/Vt = C2/(C1 + C2).$$

Therefore, the voltage drop for a given total voltage across one capacitor can be raised by increasing the capacitance of the other capacitor. By raising the capacitance between polysilicon gate 13 and floating gates 10, the voltage between polysilicon regions/floating gates 10 and epitaxial layer 1b is increased for a given voltage between epitaxial layer 1b and poly silicon layer 13. Empirical evidence has shown that a floating gate field effect transistor memory cell constructed according to the teachings of this invention requires a writing voltage level approximately 30 percent smaller than that required in the cell described in McElroy. This allows the EPROM cells and their drive circuitry to be reduced in size accordingly.

As discussed above, the present invention additionally contemplates an embodiment which uses conductive regions immediately overlying N++ regions 7, 8, and 9. These conductive regions lower the sheet resistance of N++ regions 7, 8, and 9. FIGS. 5A through 5F illustrate a procedure which a preferred embodiment utilizes to form these conductive regions, which consist of buried silicide layers. The process depicted in FIGS. 5A through 5F may be inserted into the above described process starting with the structure shown in FIG. 2D. Then, the process illustrated in FIG. 5A through 5F may be utilized in lieu of the process discussed above in connection with FIG. 2E to form the buried silicide layers.

Figure 5A:
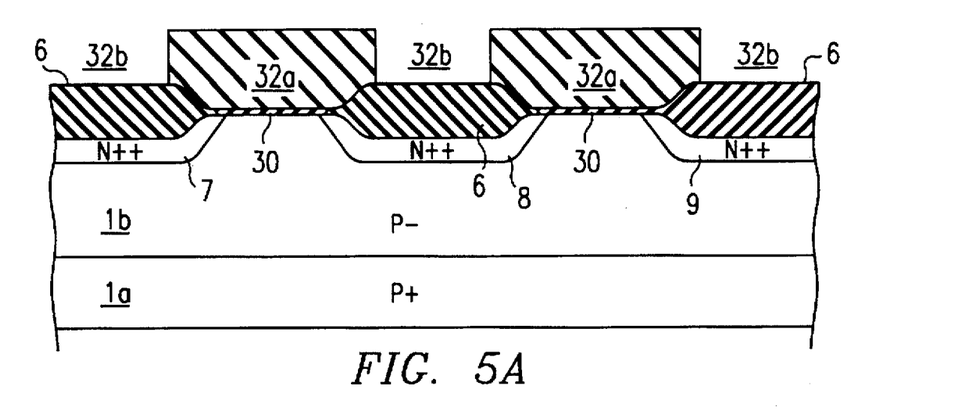
FIGS. 5A through 5F show side-view diagrams that illustrate the processing steps performed to fabricate a silicided, buried column line.

Accordingly, FIG. 5A shows the structure of FIG. 2D with the addition of a photoresist mask thereon. Specifically, the photoresist mask contains solid portions 32a, and gaps 32b. Gaps 32b overlie central portions of field oxide regions 6, and solid portions 32a overlie thin oxide regions 30 and the portions of field oxide 6 which reside near the boundary between field oxide 6 and thin oxide 30. In the preferred embodiment, field oxide 6 is approximately 3 microns wide. Furthermore, gaps 32b are approximately 2 microns wide and centered overlying thick oxide 6 so that centers of gaps 32b substantially overlie centers of field oxide regions 6.

Figure 5B:
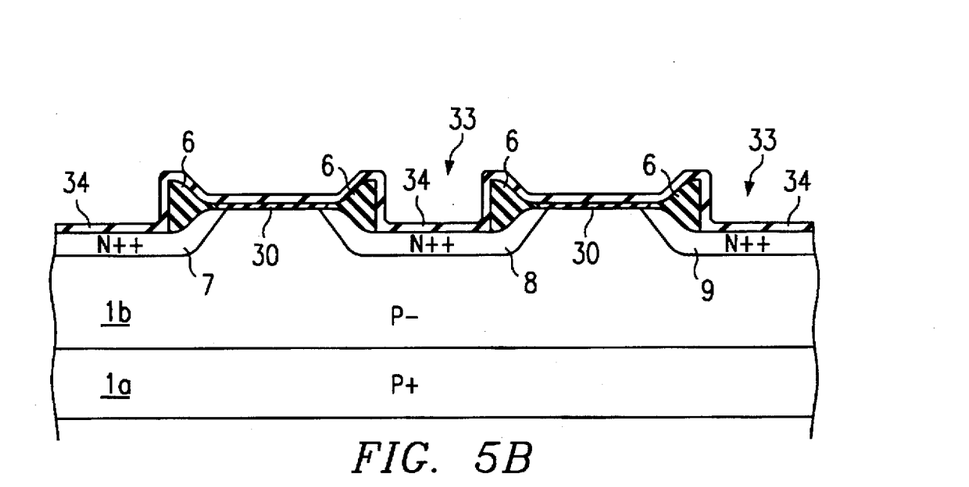

Next, field oxide regions 6 are anisotropically etched in the areas defined by openings 32b. The etching removes portions of field oxide regions 6 until the etching causes diffused regions 7, 8, and 9 to become exposed. FIG. 5B shows slots 33 which are formed as a result of this etching. In the preferred embodiment, field oxide regions 6 exhibit a thickness of approximately 4,000 angstroms. Thus, this etching step removes approximately 4,000 angstroms of thermally grown oxide.

Next, photoresist mask 32a32b is removed and a layer of a refractory metal 34, such as titanium, tungsten, molybdenum, tantalum, hafnium, vanadium, and the like, is sputtered overlying the surface of the structure. The preferred embodiment applies titanium at 150° C. until a thickness of approximately 1,000 angstroms is achieved. The resulting structure is shown in FIG. 5B.

Figure 5C:
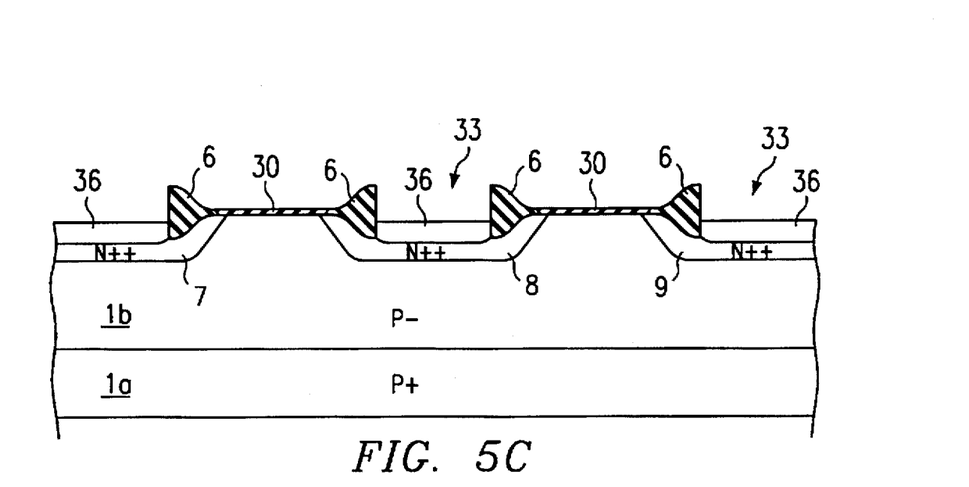

Referring to FIG. 5C, an approximately 675° C. nitrogen environment for 30 minutes is used to form a metallic silicide 36. Silicide 36 forms wherever refractory metal 34 (see FIG. 5B) contacts silicon. Thus, silicide 36 forms within slots 33 overlying N++ regions 7, 8 and 9. In the preferred embodiment, the 1,000 angstrom thickness of refractory metal 34 combines with approximately 1,000 angstroms of silicon from the N++ diffusion regions 7, 8 and 9. Consequently, the resulting silicide 36 is approximately 2,000 angstroms thick. In the preferred embodiment, buried diffusion regions 7, 8 and 9 are each approximately 5,000 angstroms thick prior to the formation of silicide 36. Thus, N++ regions 7, 8 and 9 now exhibit a thickness of approximately 4,000 angstroms underlying silicide 36.

After the formation of silicide 36, an annealing step is performed at approximately 800° C. for approximately 30 minutes. Then, unreacted portions of refractory metal 34 (See FIG. 5B) are removed from oxide areas 6 and 30. The structure shown in FIG. 5C results.

Figure 5D:
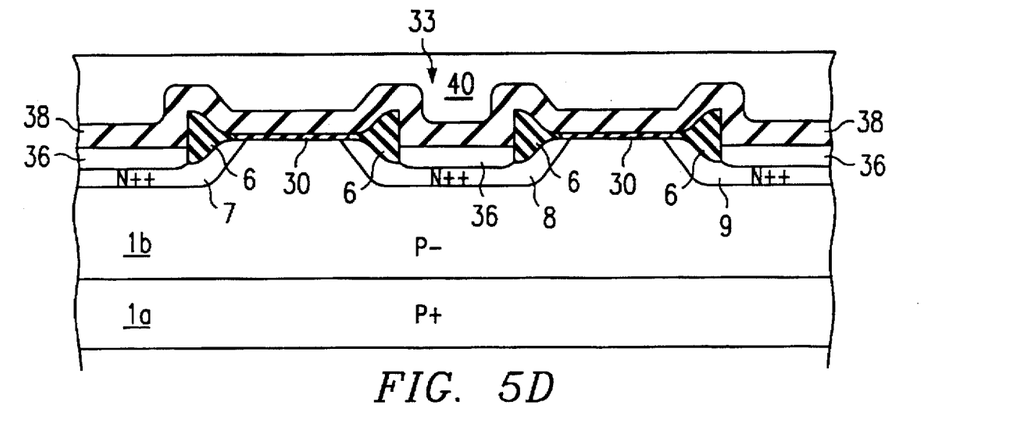

Referring to FIG. 5D, the process next deposits a conformal oxide coding 38, such as the TEOS oxide discussed above, to a depth of approximately 5,000 angstroms overlying the entire surface of the structure. The 5,000 angstrom thickness of conformal oxide 38 fills slots 33. After the application of conformal oxide layer 38, a glass layer 40 is spun-on in a manner well-known to those skilled in the art to provide a planar surface overlying the structure. FIG. 5D illustrates the resulting structure after the application of glass layer 40.

Figure 5E:
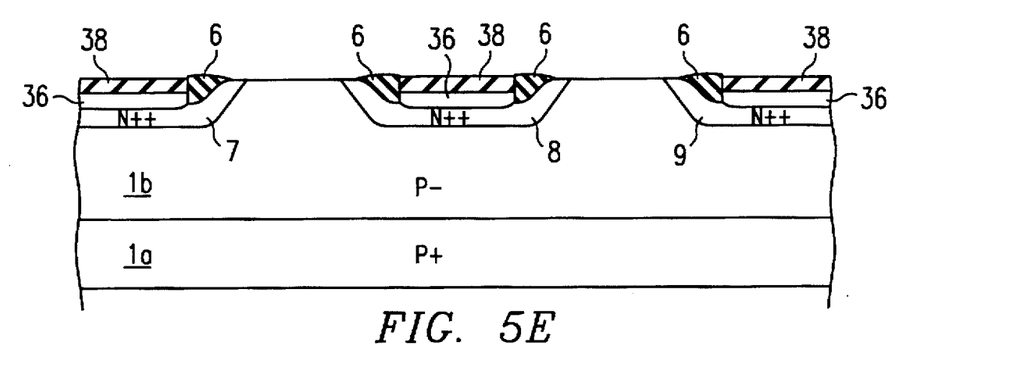

Referring to FIG. 5E, an etch-back step is next performed to remove unneeded oxides from the surface of the structure and to expose P− silicon layer 1b. An etch chemistry used in this etching step etches glass layer 40, deposited oxide layer 38, and field oxide 6 at approximately equal rates. However, conventional etch chemistries known to those skilled in the art may etch thermally grown oxide layer 6 at a slightly slower rate than glass layer 40 and deposited oxide layer 38 without generating undesirable consequences. Nevertheless, the resulting etched surfaces of oxide layer 6 and oxide layer 38 are approximately coplanar with the surface of substrate layer 1b.

The resulting structure from this etch-back step is illustrated in FIG. 5E. The fabrication of the field insulator regions is now complete. Each of these field insulator regions includes both a thermally grown field oxide 6 and deposited oxide 38. The field insulator regions exhibit a thickness of approximately 2,000 angstroms.

It will be understood by those skilled in the art that while the thickness of the field insulator region is reduced in the embodiment shown in FIG. 5E from that depicted in FIG. 2E, the overall isolation function of this field insulator region may in fact be improved. The resistance portion of the RC time constant characterizing the coupling between diffusions 7, 8 and 9 and overlying poly layers may be reduced by, for example, a factor of 10 or more due to the inclusion of silicide 36. Thus, while the narrowing of the field insulator region may tend to increase capacitance by a factor of around two to four, a reduction in resistance by a factor of 10 achieves a significantly reduced overall RC time constant.

Figure 5F:
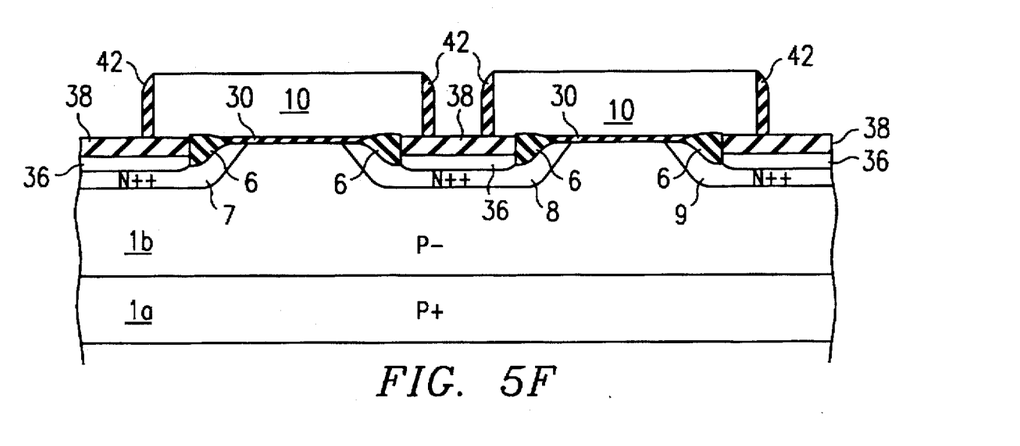

Referring now to FIG. 5F, a process step is shown which is similar to the process step discussed above in connection with FIG. 2E. Specifically, thin oxide region 30 is regrown to form a gate oxide, and poly layer 10 is deposited overlying thin oxide 30 and the field insulator regions, as discussed above. Poly layer 10 is applied to a thickness of approximately 3,000 angstroms. Next, poly layer 10 is doped with POC13 at approximately 950° C. so that a sheet resistance of approximately 30 ohms/square is achieved. Next, poly layer 10 is patterned and etched as discussed above and shown in FIG. 3. Sidewall oxide filaments 42 may then be grown on exposed sidewalls of poly layer 10.

In the preferred embodiment, the field insulator region, which consists of thick oxide 6 and deposited oxide 38, is approximately 3 microns wide. Poly layer 10 overlaps each of the field insulation regions by approximately 1 micron. Thus, a one micron gap between strips of poly layer 10 exists centrally located on each of the field insulator regions.

The process of the present invention then continues substantially as discussed above in connection with FIGS. 2F through 2G. However, those skilled in the art will recognize that the field insulator regions and underlying structures beneath poly layer 10 will resemble the structure shown in FIG. 5F rather than the specific structure shown in FIGS. 2F through 2G.

Accordingly, a transistor memory cell array may be constructed to provide a decreased sheet resistance for buried diffusions. A typical resistance of buried diffusions 7, 8 and 9 alone may be approximately 30 ohms/square. A typical sheet resistance of silicide 36 constructed according to the process discussed above would be approximately 3 ohms/square. A combination of silicide 36 with diffusions 7, 8 and 9 forms a structure which is electrically equivalent to two conductors in parallel with each other. Consequently, the combined resistance of silicide 36 and buried diffusions 7, 8, and 9 is slightly less than 3 ohms/square. An approximately 10-fold decrease in resistance has been achieved by the addition of silicide 36.

In summary, the present invention provides a method whereby EPROM memory cells may be programmed using a reduced voltage. The use of a reduced voltage permits the use of smaller memory cells in the construction of an EPROM. In addition, one embodiment of the present invention provides a method for reducing the sheet resistance of buried diffusions, such as the buried diffusions which form column lines of an EPROM memory array. The reduced resistance permits the use of fewer contacts between the buried diffusions and overlying metallic layers. Consequently, semiconductor substrate area may be used for memory cells rather than such contacts.

The foregoing description uses various embodiments to illustrate the present invention. However, those skilled in the art will recognize that changes and modifications may be made in these embodiments without departing from the scope of the present invention. For example, the precise dimensions disclosed herein may vary widely. In addition, substantially equivalent structures to those described herein may be obtained using processes which differ slightly from those described above. These and other modifications obvious to those skilled in the art are intended to be included within the scope of this invention.

What is claimed is:

1. An array of rows and columns of memory cells comprising:

a substrate having a first conductivity type;

a plurality of source/drain regions formed in the surface of said substrate, said source/drain regions having a second conductivity type opposite said first conductivity type and said source/drain regions extending at least between two adjacent rows of memory cells of said array;

a plurality of field insulating regions formed on a portion of the surfaces of said source/drain regions;

a plurality of slots etched in said field insulating regions, said slots exposing the surface of said source/drain regions and extending the length of said source/drain regions and extending at least between two adjacent rows of memory cells of said array;

a first plurality of conductive layers formed directly on and extending the length of the exposed portion of said source/drain regions;

a plurality of insulating layers formed on the surface of said conductive layer; and a plurality of gates controlling conductivity between said source/drain regions.

2. An array as in claim 1 wherein said gates comprise:

a first insulating layer formed on the surface of said substrate between said source/drain regions;

a floating gate formed on the surface of said first insulating layer;

a second insulating layer formed on the surface of said floating gate; and a control gate formed on said second insulating layer.

3. An array as in claim 2 wherein said control gate comprise a wordline extending between at least two columns of memory cells of said array.

4. An array as in claim 1 wherein said conductive layers comprise refractory metal silicide.

5. An array as in claim 1 wherein said field insulating regions comprise silicon dioxide.

6. An array as in claim 5 wherein said field insulating regions are grown by thermal oxidation of substrate.

7. An array as in claim 1 wherein said substrate comprises crystalline silicon.

8. The array of claim 1 wherein said plurality of insulating layers define a plurality of apertures extending to said first plurality of conductive layers and further comprising:

a second plurality of conductive layers extending parallel to said first conductive layers and over said apertures so as to be in electrical contact with said first plurality of conductive layers.

* * * * *